(12) United States Patent
Kumar et al.

(10) Patent No.: US 8,020,292 B1
(45) Date of Patent: Sep. 20, 2011

(54) METHODS OF MANUFACTURING PRINTED CIRCUIT BOARDS

(75) Inventors: Rajesh Kumar, Mission Viejo, CA (US); Monte P. Dreyer, Rancho Santa Margarita, CA (US); Michael J. Taylor, Longmont, CO (US)

(73) Assignee: DDI Global Corp., Anaheim, CA (US)

( * ) Notice: Subject to any disclaimer, the term of this patent is extended or adjusted under 35 U.S.C. 154(b) by 0 days.

(21) Appl. No.: 12/772,086

(22) Filed: Apr. 30, 2010

(51) Int. Cl.
*H01K 3/10* (2006.01)

(52) U.S. Cl. ............... 29/852; 29/825; 29/829; 29/830; 29/840; 427/97.2; 427/97.7

(58) Field of Classification Search .............. 29/825, 29/829, 830, 846, 847, 852; 427/97.2, 97.7
See application file for complete search history.

(56) References Cited

U.S. PATENT DOCUMENTS

| | | | | |
|---|---|---|---|---|
| 5,481,795 A | * | 1/1996 | Hatakeyama et al. | .......... 29/852 |
| 5,613,033 A | | 3/1997 | Swamy et al. | |
| 5,939,789 A | * | 8/1999 | Kawai et al. | ................. 257/758 |
| 6,000,129 A | | 12/1999 | Bhatt et al. | |
| 6,211,487 B1 | * | 4/2001 | Hatakeyama et al. | ... 219/121.71 |
| 6,222,740 B1 | | 4/2001 | Bovensiepen et al. | |
| 6,440,542 B1 | | 8/2002 | Kariya | |
| 6,555,761 B2 | | 4/2003 | Amir | |
| 6,631,558 B2 | | 10/2003 | Burgess | |
| 6,779,262 B1 | | 8/2004 | Gales et al. | |
| 6,889,433 B1 | * | 5/2005 | Enomoto et al. | ................. 29/852 |
| 6,954,986 B2 | | 10/2005 | Schmidt | |
| 7,260,890 B2 | | 8/2007 | White et al. | |
| 7,402,758 B2 | | 7/2008 | Mattix | |
| 7,523,545 B2 | | 4/2009 | Kumar et al. | |
| 2005/0016768 A1 | | 1/2005 | Zollo et al. | |
| 2007/0196953 A1 | | 8/2007 | Fasano et al. | |
| 2007/0246254 A1 | | 10/2007 | Kumar et al. | |

OTHER PUBLICATIONS

International Search Report for Application No. PCT/US10/033295 filed Apr. 30, 2010, dated Jul. 9, 2010, mailed Jul. 29, 2010, 2 pages.
Written Opinion for Application No. PCT/US10/033295 filed Apr. 30, 2010, dated Jul. 9, 2010, mailed Jul. 29, 2010, 5 pages.

* cited by examiner

*Primary Examiner* — Carl Arbes
(74) *Attorney, Agent, or Firm* — Christie, Parker & Hale, LLP

(57) ABSTRACT

Methods of manufacturing printed circuit boards using parallel processes to interconnect with subassemblies are provided. In one embodiment, the invention relates to a method of manufacturing a printed circuit board including providing a core subassembly including at least one metal layer, providing a plurality of one-metal layer carriers after parallel processing each of the plurality of one-metal layer carriers, and attaching at least two of the plurality of one-metal layer carriers with each other and with the core subassembly.

17 Claims, 12 Drawing Sheets

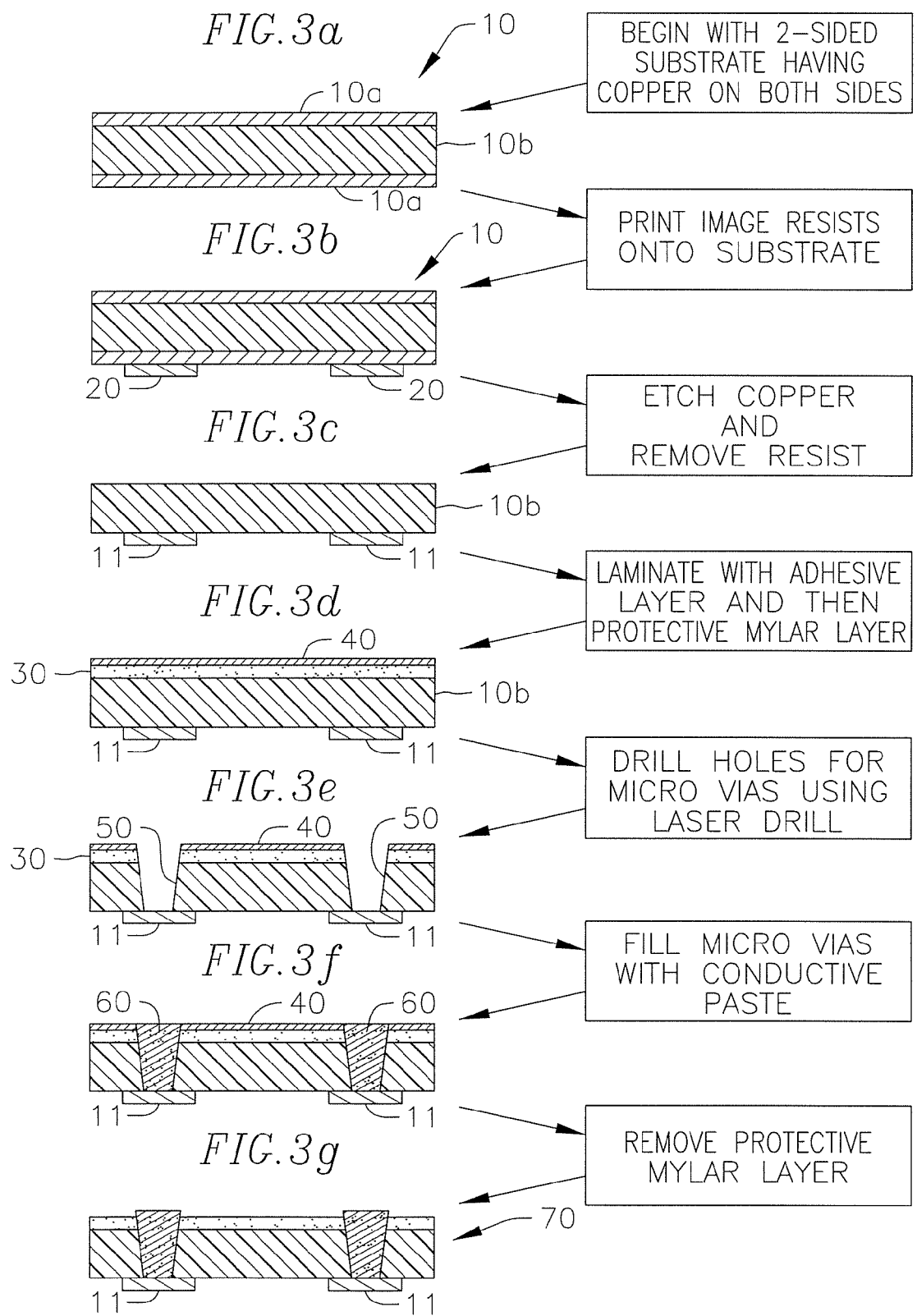

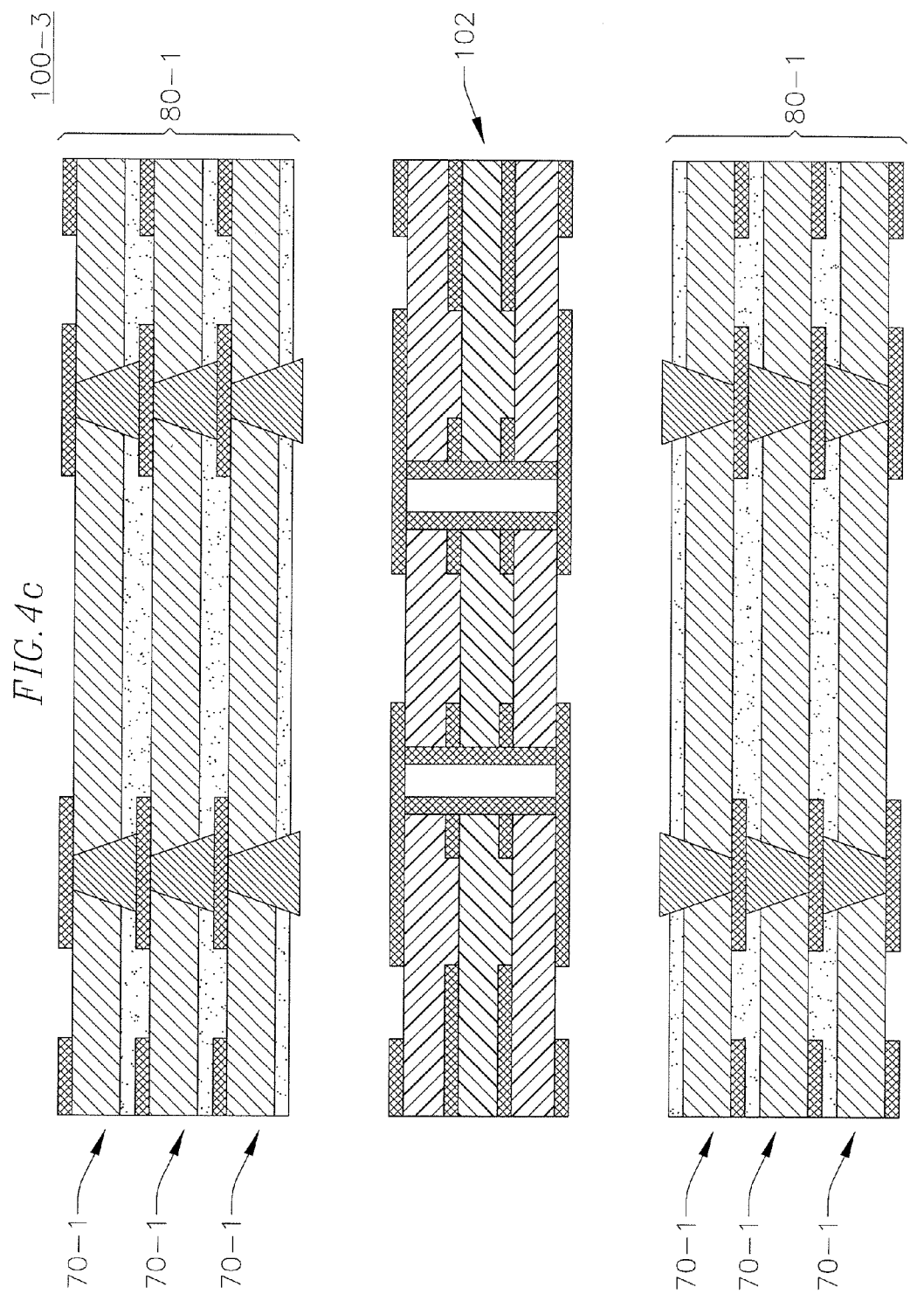

METHODS OF MANUFACTURING PRINTED CIRCUIT BOARDS

FIELD OF THE INVENTION

The present invention relates generally to printed circuit boards and methods of manufacturing the same, and more particularly, to methods of manufacturing printed circuit boards using parallel processes to interconnect with subassemblies.

BACKGROUND

Most electronic systems include printed circuit boards with high density electronic interconnections. A printed circuit board (PCB) may include one or more circuit cores, substrates, or carriers. In one fabrication scheme for the printed circuit board having the one or more circuit carriers, electronic circuitries (e.g., pads, electronic interconnects, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, drilling through-holes, and then plating the through-holes with a copper material to interconnect the circuit layer pairs.

The curing process is used to cure the adhesives to provide for permanent physical bonding of the circuit board structure. However, the adhesives generally shrink significantly during the curing process. The shrinkage combined with the later through-hole drilling and plating processes can cause considerable stress into the overall structure, leading to damage or unreliable interconnection or bonding between the circuit layers. Thus, there is a need for material and associated processes which can compensate for this shrinkage and can provide for a more stress-free and reliable electronic interconnection between the circuit layer pairs.

In addition, the plating of the through-holes (or vias) with the copper material requires an additional, expensive, and time consuming process sequence that is difficult to implement with a quick turnaround. FIG. 1 is a flowchart of a sequential lamination process for manufacturing a printed circuit board having stacked vias including expensive and time consuming sequential lamination and plating steps. Thus, there is a need to provide a printed circuit board and a method of manufacturing the same that can be quickly and easily fabricated and/or ensure alignment of the interconnections (or through-holes or micro vias) on the printed circuit board by reducing iterations of key processes to thereby reduce manufacturing time and cost.

SUMMARY

Aspects of embodiments of the invention relate and are directed to methods of manufacturing printed circuit boards using parallel processes to interconnect with subassemblies. One embodiment of the invention provides a method of manufacturing a printed circuit board including providing a core subassembly including at least one metal layer carrier, providing a plurality of one-metal layer carriers after parallel processing each of the plurality of one-metal layer carriers, where the parallel processing of at least one of the plurality of one-metal layer carriers includes imaging photo resist onto at least one part of a substrate having at least one copper foil formed on a first surface of the substrate, etching portions of the at least one copper foil from the substrate, removing the at least one photo resist to expose the at least one part of the at least one copper foil thereby forming at least one copper foil pad, applying a lamination adhesive to a second surface of the substrate, applying a protective film to the lamination adhesive, forming at least one micro via in the second surface of the substrate to expose the at least one copper foil pad, filling conductive paste into the at least one micro via, and removing the protective film to expose the lamination adhesive on the substrate for attachment, and attaching at least two of the plurality of one-metal layer carriers with each other and with the core subassembly.

Another embodiment of the invention provides a method of manufacturing a printed circuit board including providing a core subassembly including at least one metal layer carrier, providing a plurality of one-metal layer carriers after parallel processing each of the plurality of one-metal layer carriers, where the parallel processing of at least one of the plurality of one-metal layer carriers includes imaging photo resist onto at least one part of a substrate having at least one copper foil formed on a first surface of the substrate, etching portions of the at least one copper foil from the substrate, removing the at least one photo resist to expose the at least one part of the at least one copper foil thereby forming at least one copper foil pad, applying a lamination adhesive to a second surface of the substrate, applying a protective film to the lamination adhesive, forming at least one micro via in the second surface of the substrate to expose the at least one copper foil pad, filling conductive paste into the at least one micro via, and removing the protective film to expose the lamination adhesive on the substrate for attachment, attaching at least two of the plurality of one-metal layer carriers with each other and with a first surface of the core subassembly, and attaching at least two of the plurality of one-metal layer carriers with each other and with the core subassembly.

Still another embodiment of the invention provides a method of manufacturing a printed circuit board including providing a core subassembly including at least one metal layer carrier, attaching a plurality of one-metal layer carriers with each other after parallel processing each of the plurality of one-metal layer carriers to form a first subassembly, where the parallel processing of at least one of the plurality of one-metal layer carriers includes imaging photo resist onto at least one part of a substrate having at least one copper foil formed on a first surface of the substrate, etching portions of the at least one copper foil from the substrate, removing the at least one photo resist to expose the at least one part of the at least one copper foil thereby forming at least one copper foil pad, applying a lamination adhesive to a second surface of the substrate, applying a protective film to the lamination adhesive, forming at least one micro via in the second surface of the substrate to expose the at least one copper foil pad, filling conductive paste into the at least one micro via, and removing the protective film to expose the lamination adhesive on the substrate for attachment, attaching a plurality of one-metal layer carriers with each other after parallel processing each of the plurality of one-metal layer carriers to form a second subassembly, attaching the first subassembly to a first surface of the core subassembly, and attaching the second subassembly to a second surface of the core subassembly.

BRIEF DESCRIPTION OF THE DRAWINGS

FIGS. 3a-3g illustrate a process for manufacturing a single metal layer substrate for a printed circuit board to be used in a single lamination cycle or process sequence with stacked (or staggered) micro vias in accordance with one embodiment of the present invention.

FIG. 4c is a cross sectional exploded view of a mixed printed circuit board including six of the single metal layer substrates of FIG. 3g in a pre-compressed form sandwiching a core subassembly in accordance with one embodiment of the present invention.

DETAILED DESCRIPTION

Figure 1:
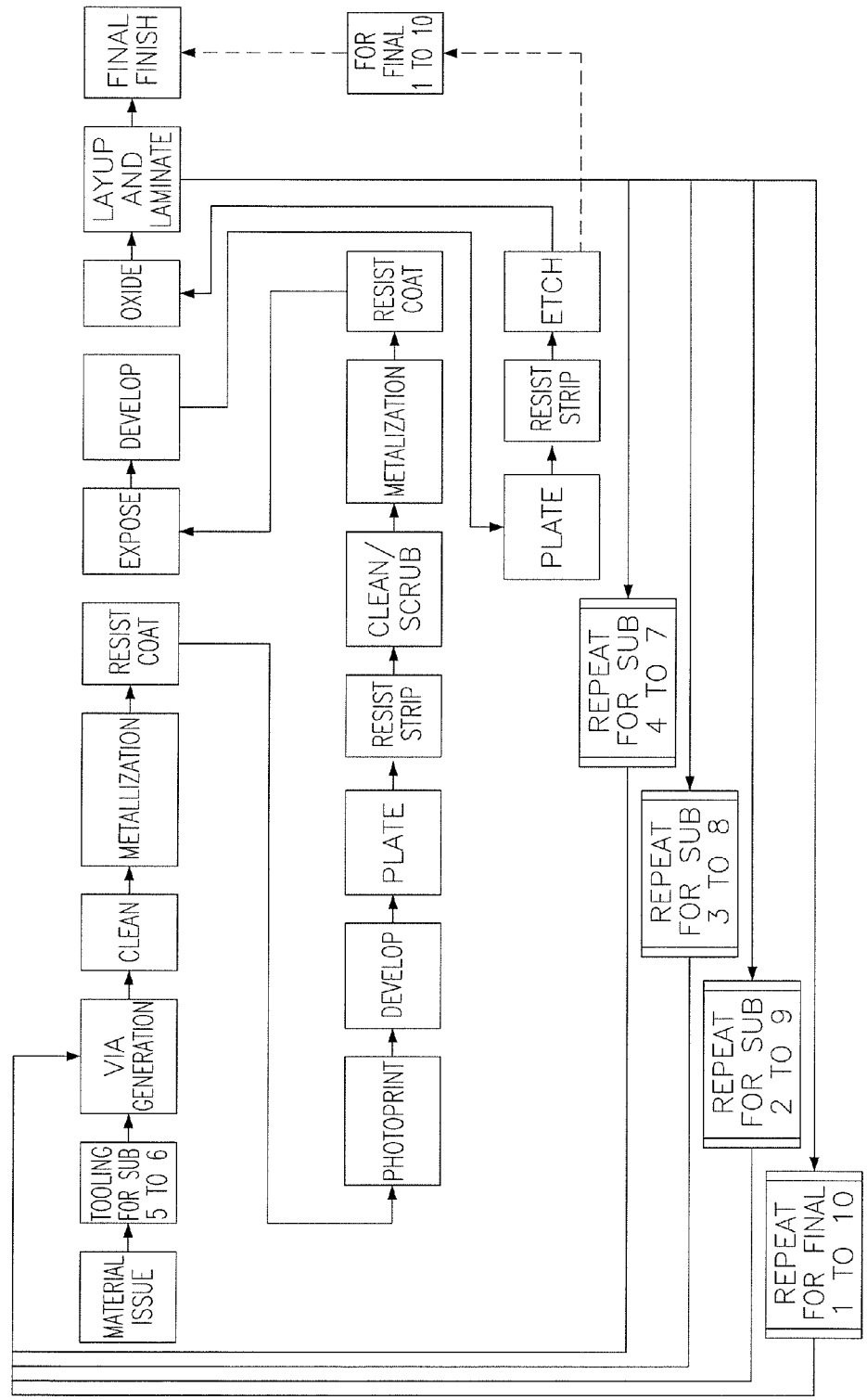
FIG. 1 is a flowchart of a sequential lamination process for manufacturing a printed circuit board having stacked vias including sequential lamination and plating steps.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements.

Figure 2:
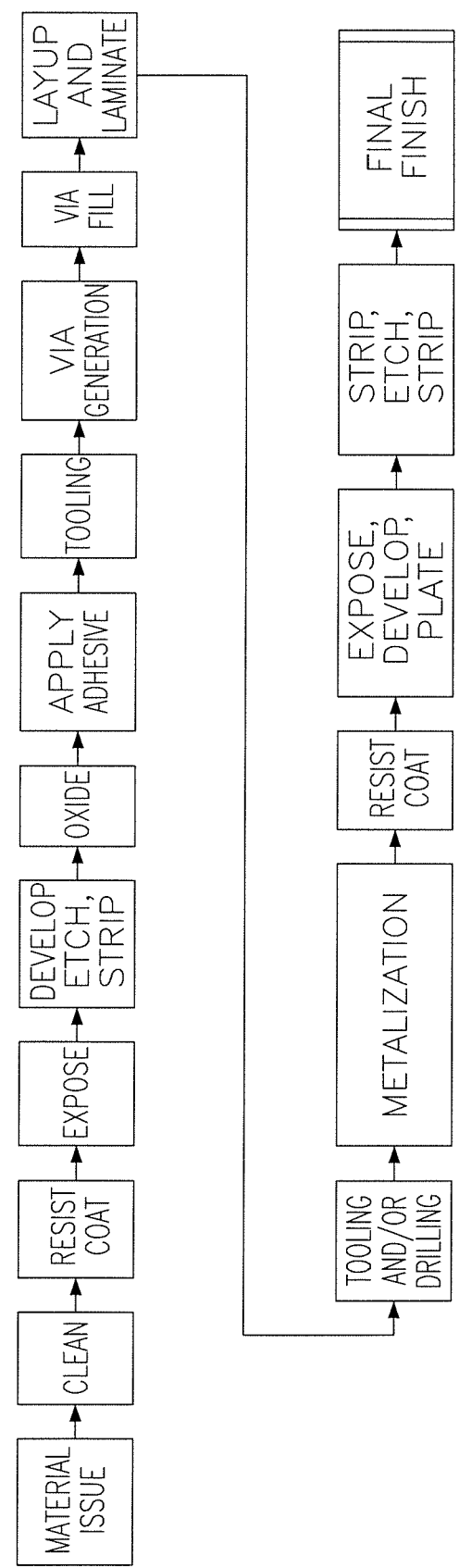
FIG. 2 is a flowchart of a process for manufacturing a printed circuit board having stacked vias including a single lamination process in accordance with one embodiment of the present invention.

FIG. 2 is a flowchart of a process for manufacturing a printed circuit board having stacked vias including a single lamination process in accordance with one embodiment of the present invention. As compared to the prior art process of FIG. 1, the single lamination process of FIG. 2 includes a substantially fewer number of process steps. More specifically, the single lamination process of FIG. 2 eliminates a number of laminating and plating process steps required of sequential lamination processes for manufacturing multilayer printed circuit boards. Aspects of single lamination processes for manufacturing circuit boards are further described in U.S. Pat. No. 7,523,545 and U.S. Prov. Patent Appl. Ser. No. 61/189,171, the entire content of each document is incorporated herein by reference.

In the flowchart illustrated in FIG. 2, the process performs a number of process steps related to printed circuit boards. In other embodiments, other suitable printed circuit board techniques can be used instead of those illustrated, including traditional PCB manufacturing techniques. In some embodiments, the process does not perform all of the actions described. In other embodiments, the process performs additional actions. In one embodiment, the process performs the actions in a different order than illustrated. In some embodiments, the process performs some of the actions simultaneously. In one embodiment, the process goes directly from "LAYUP AND LAMINATE" to "FINAL FINISH". In one embodiment, "DEVELOP, PLATE, STRIP, ETCH, STRIP" is replaced by "DEVELOP, ETCH, STRIP".

FIGS. 3a-3g illustrate a process for manufacturing a single metal layer substrate for a printed circuit board to be used in a single lamination cycle or process sequence with stacked (or staggered) micro vias in accordance with one embodiment of the present invention.

As shown in FIG. 3a, a two-sided substrate or carrier 10 is prepared. The substrate 10 includes a copper foil 10a formed on opposite sides or surfaces of the substrate 10 and a core material 10b made of metal, ceramic, or insulating material (e.g., FR4, LCP, Thermount, BT, GPY, such as Teflon, thermally conducting carbon (stablecor), halogen free insulating material, etc., where GPY is a laminate that does not fit in the FR4 category, such as polyimide, polyimide film such as Kapton®, aziridine cured epoxy, bismalimide, and other electrical grades of laminate). The present invention, however, is not thereby limited. For example, in one embodiment of the present invention, a single sided core or substrate is used having a copper foil (e.g., a single foil 10a) formed on only one side of the substrate. In other embodiments, other suitable substrate and conductive layer materials can be used.

In the embodiment shown in FIG. 3a, the substrate 10 has a thickness ranging from 3 to 4 mils (or about 3 to 4 mils). However, in other embodiments, the substrate and other components can have other suitable dimensions.

In FIG. 3b, two photo resists 20 are imaged onto the substrate 10. Here, the two photo resists 20 shown are laser-direct-imaged (or printed) onto one side of the substrate 10 (i.e., the bottom side). However, the present invention is not thereby limited. For example, the two photo resists can be imaged using any suitable printing technique, such as photo, silkscreen, offset, inkjet, and the like. In other embodiments, more than or less than two photo resists can be imaged onto the substrate.

In FIG. 3c, the copper foil 10a is etched from the substrate 10 with the exception of the parts of the copper foil 10a covered by the two photo resists 20, which are then stripped off to expose corresponding copper foil pads 11. The present invention, however, is not thereby limited. For example, in another embodiment of the present invention, one or more one-metal layer carriers (e.g., one or more single sided circuits) are formed by preparing a metal plate (e.g., a stainless steel plate).

In more detail regarding the process for using the metal plate, a copper flash (about five microns) is electrolytic flash plated onto one or more sides the metal plate. One or more photo resists are applied to the one or more flash surfaces of the metal plate. The photo resists are then imaged (e.g., negative imaged) to develop one or more cavities. Copper is then plated into the cavities. The photo resists are then stripped off to form one or more copper foil pads for one or more circuit layers. In addition, one or more prepregs are applied on the copper foil pads to laminate the prepregs and the metal plate. The prepregs are then cured. The prepregs are thus laminated and cured with the metal plate, the copper foil pads and the copper flashes therebetween. The copper foil pads and the copper flashes with the cured prepregs are then peeled from the metal plate. The copper flashes are then etched off to expose the copper foil pads on the cured prepregs.

Once the above described circuit layer including the copper foil pads (e.g., pads 11 or the circuit layer including copper pads has been formed), a protective film (or Mylar sheet) 40 shown in FIG. 3d is attached to the core material 10b of the substrate 10 (or cured prepreg) with a lamination adhesive (or prepreg or uncured prepreg) 30 interposed between the Mylar sheet 40 and the core material 10b. In FIG. 3d, the protective layer or Mylar sheet 40 is shown to be attached to the side of the substrate 10 opposite to the side of the substrate 10 where the two copper foil pads 11 are located. The protective film of the present invention, however, is not limited to only Mylar sheets, and can be made of any suitable material, such as polyester, oriented polypropylene, polyvinylfluoride, polyethylene, high density polyethylene, polyethylene napthalate, pacothane, polymethylpentene, or combinations thereof.

In FIG. 3e, via or micro via holes 50 are formed in the substrate 10 (or cured prepreg). Each of the micro via holes 50 is formed by laser drilling (and/or mechanical drilling) a hole having a diameter ranging from 4 to 10 mils (or about 4 to 10 mils) into the substrate 10 (or the cured prepreg). In other embodiments, the micro via holes having other suitable diameters can be used. In another embodiment, the via or micro via holes can be created using a photo imagable dielectric process, plasma process, stamping process, or other suitable via generation processes.

In FIG. 3f, a conductive paste (or ink) 60 is filled into each of the micro vias 50 formed in the substrate 10 (or cured prepreg), and in FIG. 3g, the Mylar sheet 40 is then peeled off to form a one-metal layer carrier 70 for lay-up and lamination.

In other embodiments, the metal layer carrier can include additional layers or components. In one embodiment, for example, the metal layer carrier can include a buried resistor or a buried capacitor implemented using specific layers or laminations. The metal layer carriers can also include surface treatments including, without limitation, organometal, immersion gold, immersion silver, immersion tin, and/or outer copper prior to adhesive. These surface treatments can improve both electrical and thermal conductivity.

The metal layer carriers can be laminated using various lamination machines, including, without limitation, a cut sheet laminator, a lamination press, a hot roll laminator, a vacuum laminator, a quick lamination press, or other suitable lamination machines.

Figure 4A:
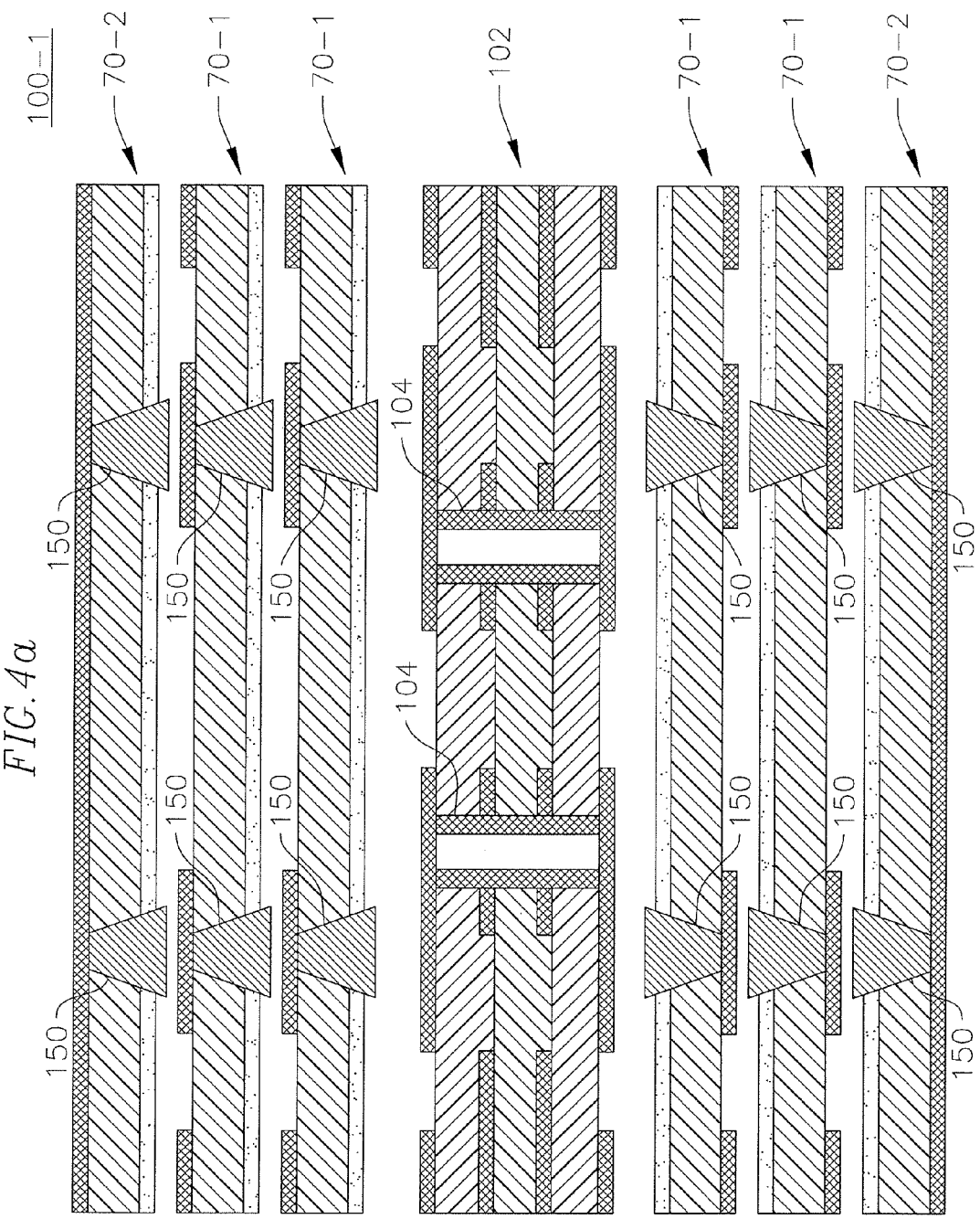
FIG. 4a is a cross sectional exploded view of a mixed printed circuit board including four etched single metal layer substrates and two non-etched single metal layer substrates of the substrates of FIGS. 3a-3g sandwiching a core subassembly in accordance with one embodiment of the present invention.

FIG. 4a is a cross sectional exploded view of a mixed printed circuit board 100-1 including four etched single metal layer substrates 70-1 and two non-etched single metal layer substrates 70-2 of the substrates of FIGS. 3a-3g sandwiching a core subassembly 102 in accordance with one embodiment of the present invention. The outer single metal layer substrates or non-etched substrates 70-2 have a non-etched layer of copper on the outer surfaces thereof. The inner single metal layer substrates 70-1 have etched layers of copper on the outer surfaces thereof.

The core subassembly 102 has four metal layers and two plated or filled through-hole vias 104 formed using a lamination process. In other embodiments, core subassembly 102 includes more than or less than two vias including through-hole vias and/or micro vias. The single metal layer substrates or carriers (70-1, 70-2) each include multiple micro vias 150 filled with conductive paste forming two stacked vias per assembly. To assemble the mixed PCB 100, the single metal layer substrates (70-1, 70-2) can be aligned above and below the core subassembly 102 and can all be pressed together to sandwich the subassembly 102 using one or more adhesive layers.

In the embodiment illustrated in FIG. 4a, the core subassembly has four metal layer carriers. In other embodiments, the core subassembly has more then or less than four metal layer carriers. In one such case, the core subassembly is assembled using a process involving only one lamination. In another such embodiment, the core subassembly is assembled using a process involving no lamination (e.g., the core subassembly has no vias). In some embodiments, the layers of the core subassembly are laminated at the time the one metal layer carriers are laminated together to form the PCB. In other embodiments, the layers of the core subassembly are laminated before the single metal layer carriers are laminated together to form the mixed PCB.

In the embodiment illustrated in FIG. 4a, three single metal layer carriers are positioned above and three single metal layer carriers are positioned below the core subassembly. In other embodiments, more than or less than three single metal layer carriers can be positioned above the core subassembly. Similarly, in other embodiments, more than or less than three single metal layer carriers can be positioned below the core subassembly. In one embodiment, one or more core subassembly layers are replaced with a single metal layer substrate having conductive paste micro vias. In the embodiment illustrated in FIG. 4a, the mixed PCB includes two stacked vias. In other embodiments, the mixed PCB can have more then or less than two stacked vias.

Figure 4B:
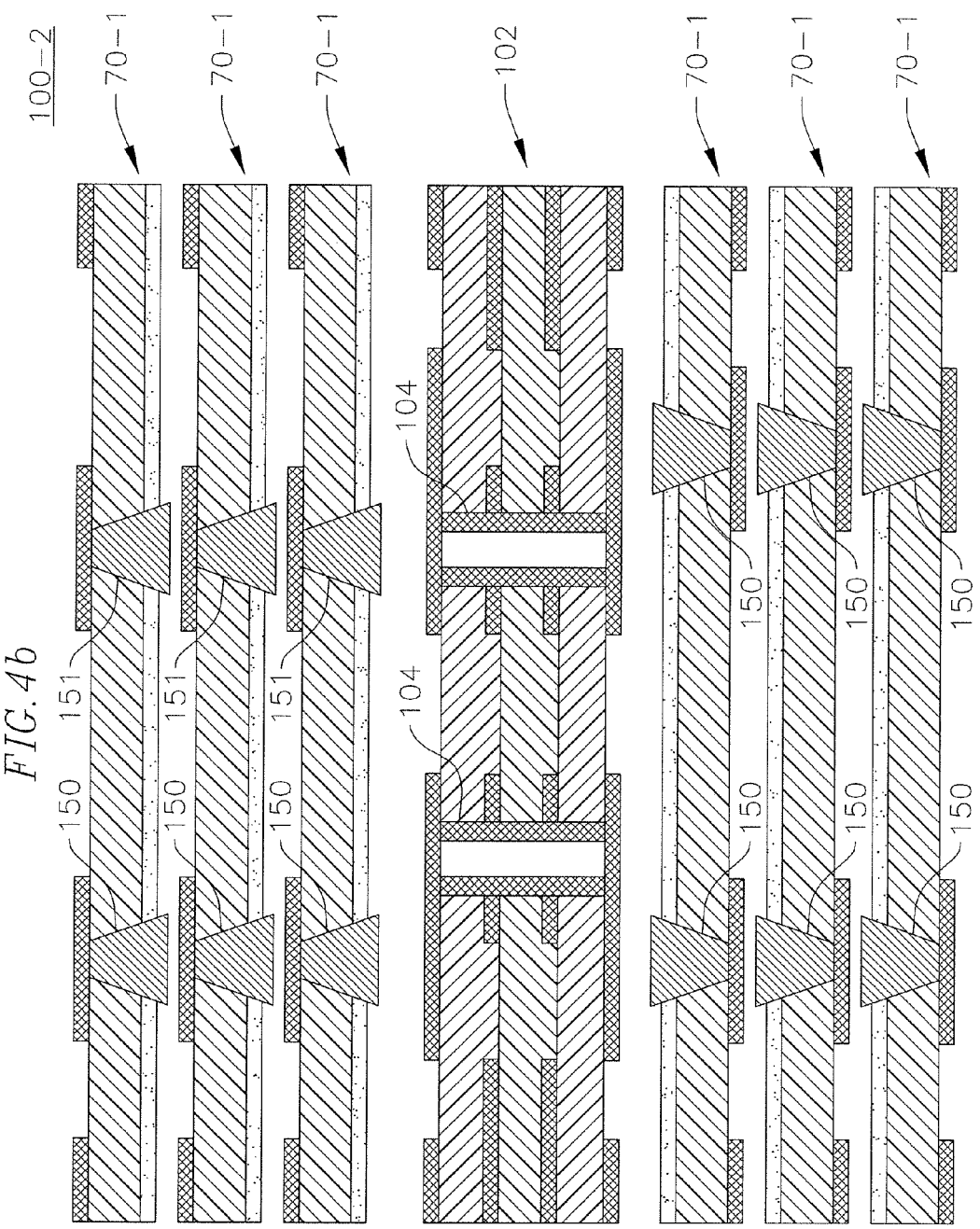
FIG. 4b is a cross sectional exploded view of a mixed printed circuit board including six of the etched single metal layer substrates of FIG. 3g sandwiching a core subassembly in accordance with one embodiment of the present invention.

FIG. 4b is a cross sectional exploded view of a mixed printed circuit board 100-2 including six of the etched single metal layer substrates 70-1 of FIG. 3g sandwiching a core subassembly in accordance with one embodiment of the present invention. FIG. 4b is substantially similar to FIG. 4a except that the outer single metal layer carriers are etched in accordance with the process described in FIGS. 3a-3g rather than non-etched as in FIG. 4a. In other respects, FIG. 4b can operate as described above for FIG. 4a. In FIG. 4b, one stack of micro vias 151 is aligned with one through hole via 104 below, while the other micro vias 150 are offset from the through hole vias 104.

FIG. 4c is a cross sectional exploded view of a mixed printed circuit board 100-3 including six of the single metal layer substrates 70-1 of FIG. 3g in a pre-compressed form sandwiching a core subassembly in accordance with one embodiment of the present invention. The precompressed form includes an upper assembly 80-1 including three of the six single metal layer substrates 70-1 and a lower assembly 80-2 including three of the six single metal layer substrates 70-1. The embodiment of FIG. 4c is similar to that of FIG. 4b except that the single metal layer substrates of FIG. 4b begin in a compressed state. In other respects, FIG. 4c can operate as described above for FIG. 4b.

Figure 5:
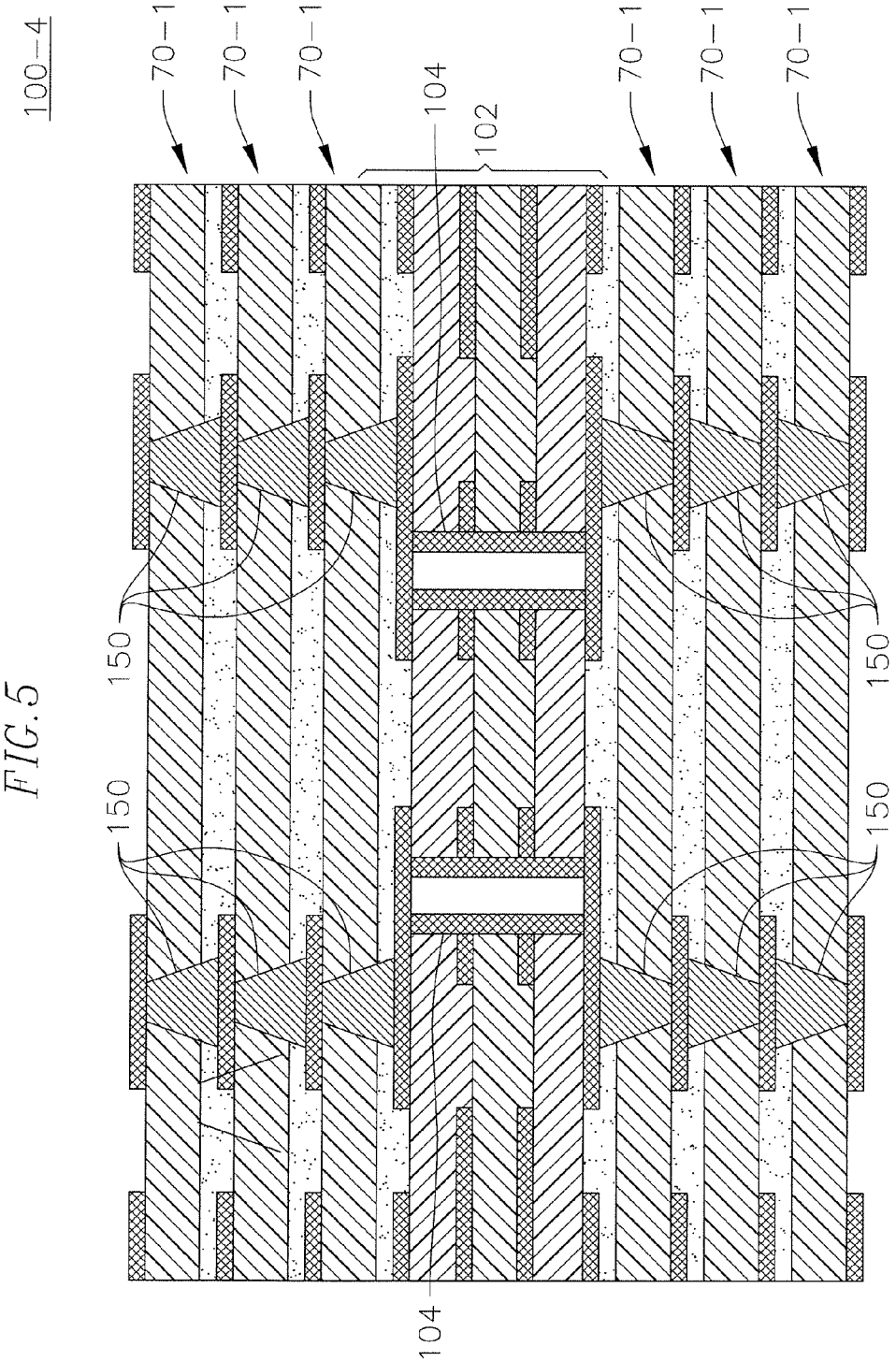
FIG. 5 is a cross sectional view of a finalized mixed printed circuit board of FIG. 4b or 4c.

FIG. 5 is a cross sectional view of a finalized mixed printed circuit board 100-4 in accordance with the embodiments of FIG. 4b or 4c. In several embodiments, a finalized mixed printed circuit board for FIG. 4a would appear similar to FIG. 5, except the outer layers would include the non-etched copper.

Figure 6:
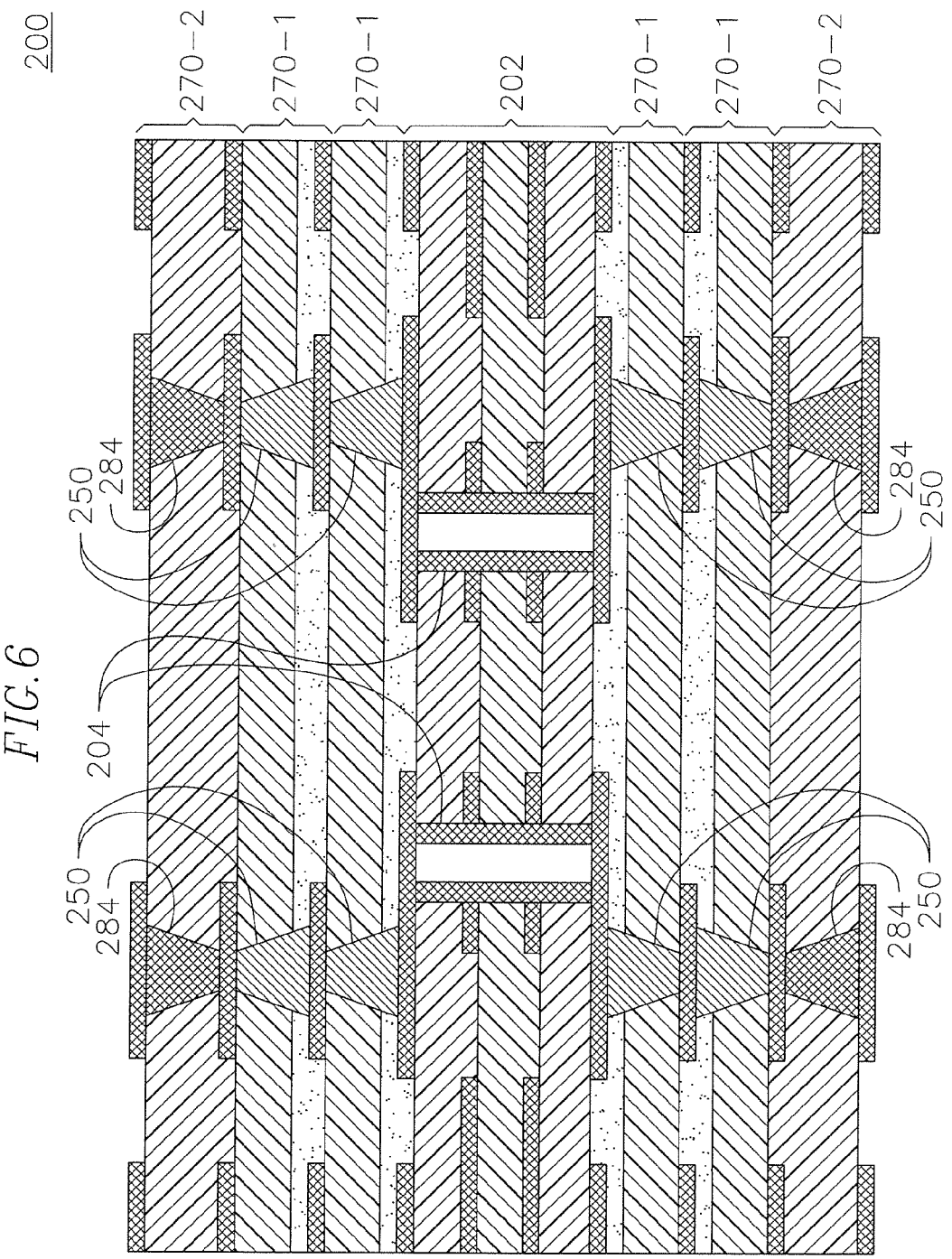
FIG. 6 is a cross sectional view of a mixed printed circuit board including an outer buildup layer sandwiching two single metal layer substrates on both sides of a four metal layer core subassembly in accordance with one embodiment of the present invention.

FIG. 6 is a cross sectional view of a mixed PCB 200 including a buildup layer 270-2 sandwiching two single metal layer substrates 270-1 on both sides of a four metal layer core subassembly 202 in accordance with one embodiment of the present invention. In several embodiments, the mixed PCB 200 includes benefits from both sequential lamination board manufacturing processes and single lamination board manufacturing processes. For example, the mixed PCB 200 can provide outer surfaces that are substantially or exactly flat. In some embodiments, these substantially or exactly flat surfaces can be highly desirable. In addition, the process of manufacturing the mixed PCB 200 can drastically improve manufacturing time and expense by eliminating various lamination and plating steps.

The four single metal layer substrates 270-1 include multiple stacked micro vias 250 and can be formed using any of the processes described above. The four metal layer core subassembly 202 includes multiple through-hole vias 204 and can be formed using the sequential lamination processes described above. In some embodiments, the through-hole vias are replaced with micro vias that are filled with either copper or conductive paste. The two buildup layers 270-2 include multiple plated or filled micro vias (e.g., through-hole vias) 284 and can be formed using processes for manufacturing PCBs described in FIG. 1.

In the embodiment illustrated in FIG. 6, the PCB includes two single metal layer substrates above and below the core subassembly. In other embodiments, the PCB can include more than two single metal layer substrates. In the embodiment illustrated in FIG. 6, one buildup layer 270-2 is positioned above and one buildup layer 270-2 is positioned below the single metal layer substrates. In other embodiments, more than one buildup layer can be positioned above and more than one buildup layer can be positioned below the single metal layer substrates. In one embodiment, one or more of the buildup layers are replaced with another layer of one of the single metal layer substrates or removed all together.

In the embodiment illustrated in FIG. 6, a four metal layer core subassembly 202 is positioned in the center of the mixed PCB 200. In other embodiments, the core subassembly can include more than or less than four layers. In the embodiment illustrated in FIG. 6, the four metal layer core subassembly includes two plated or filled through-hole vias 204. In other embodiments, the core subassembly can implemented with more than or less than two vias. In one such embodiment, the core subassembly can implemented without any vias. In the embodiment illustrated in FIG. 6, the mixed PCB includes two stacked vias. In other embodiments, the mixed PCB can have more then or less than two stacked vias.

In FIGS. 5 and 6, core subassemblies 102 and 202 include two through hole vias (104, 204) per subassembly that are offset from stacked vias 150 of the single metal layer substrates (70-1, 270-1). In other embodiments, core subassemblies 102 and 202 can include one or more micro vias. In some embodiments, the micro vias are filled with conductive paste, conductive ink or copper. In one such embodiment, the conductive ink micro vias have a trapezoidal cross section where a wider opening of the micro via is closest to a central line of the core subassembly (see for example, the orientation of micro via 150 in FIG. 5). In some embodiments, the through hole vias of the subassemblies 102 and 202 are not offset from the stacked vias of the single metal layer substrates.

Figure 7:
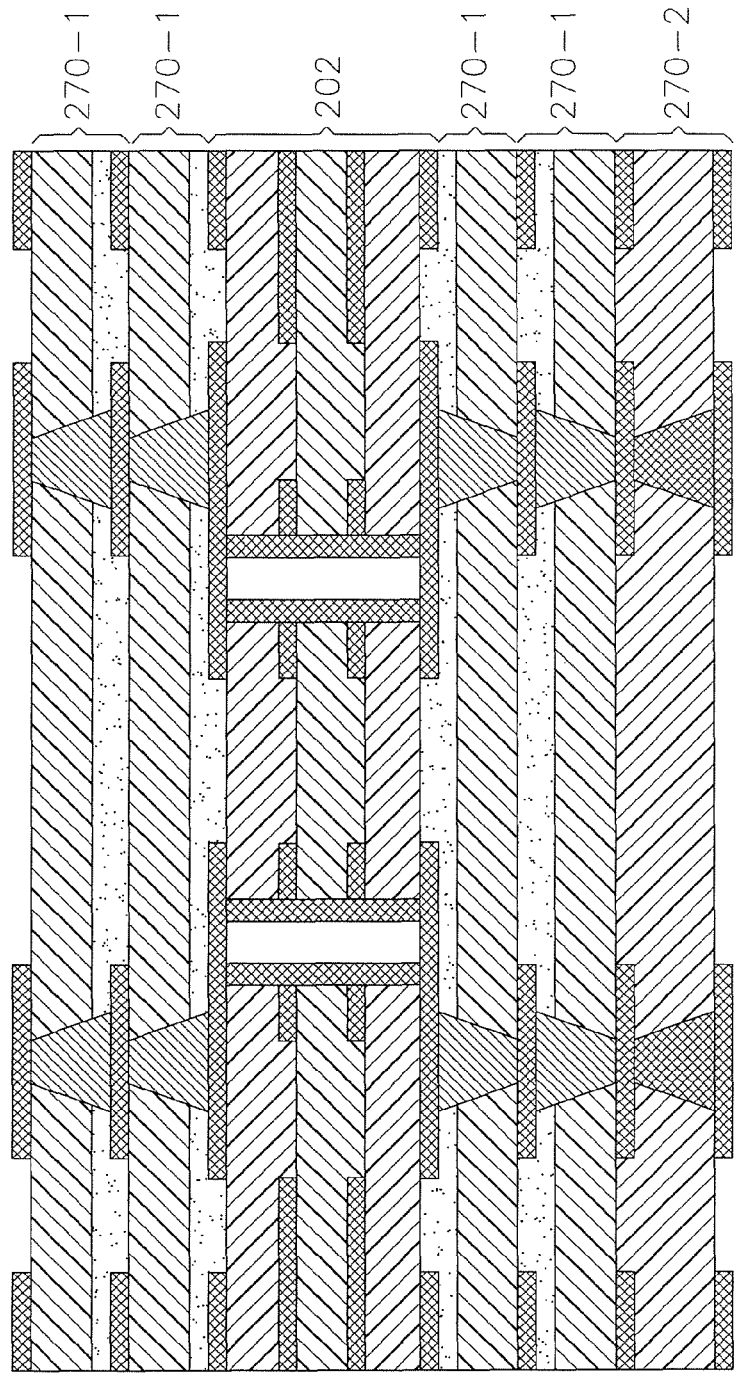
FIG. 7 is a cross sectional view of a mixed printed circuit board including one buildup layer attached to one of two single metal layer substrates sandwiching a four metal layer core subassembly in accordance with one embodiment of the present invention.

FIG. 7 is a cross sectional view of a mixed PCB 300 including one buildup layer 270-2 attached to two of four single metal layer substrates 270-1 sandwiching a four metal layer core subassembly 202 in accordance with one embodiment of the present invention. The mixed PCB 300 includes the buildup layer 270-2 sandwiching two single metal layer substrates 270-1 on one side of the core subassembly 202. The mixed PCB 300 further includes two single metal layer substrates 270-1 sandwiching the four layer core subassembly 202 on the other side of the core subassembly 202. The embodiment illustrated in FIG. 7 is similar to that of FIG. 6 except that one of the outer buildup layers has been removed. In other embodiments, one or both of the upper single metal layer carriers 270-1 can also be removed. In several embodiments, the structure of the mixed PCB of FIG. 7 can be modified in a manner similar to the modifications described above for the mixed PCB of FIG. 6.

Figure 8:
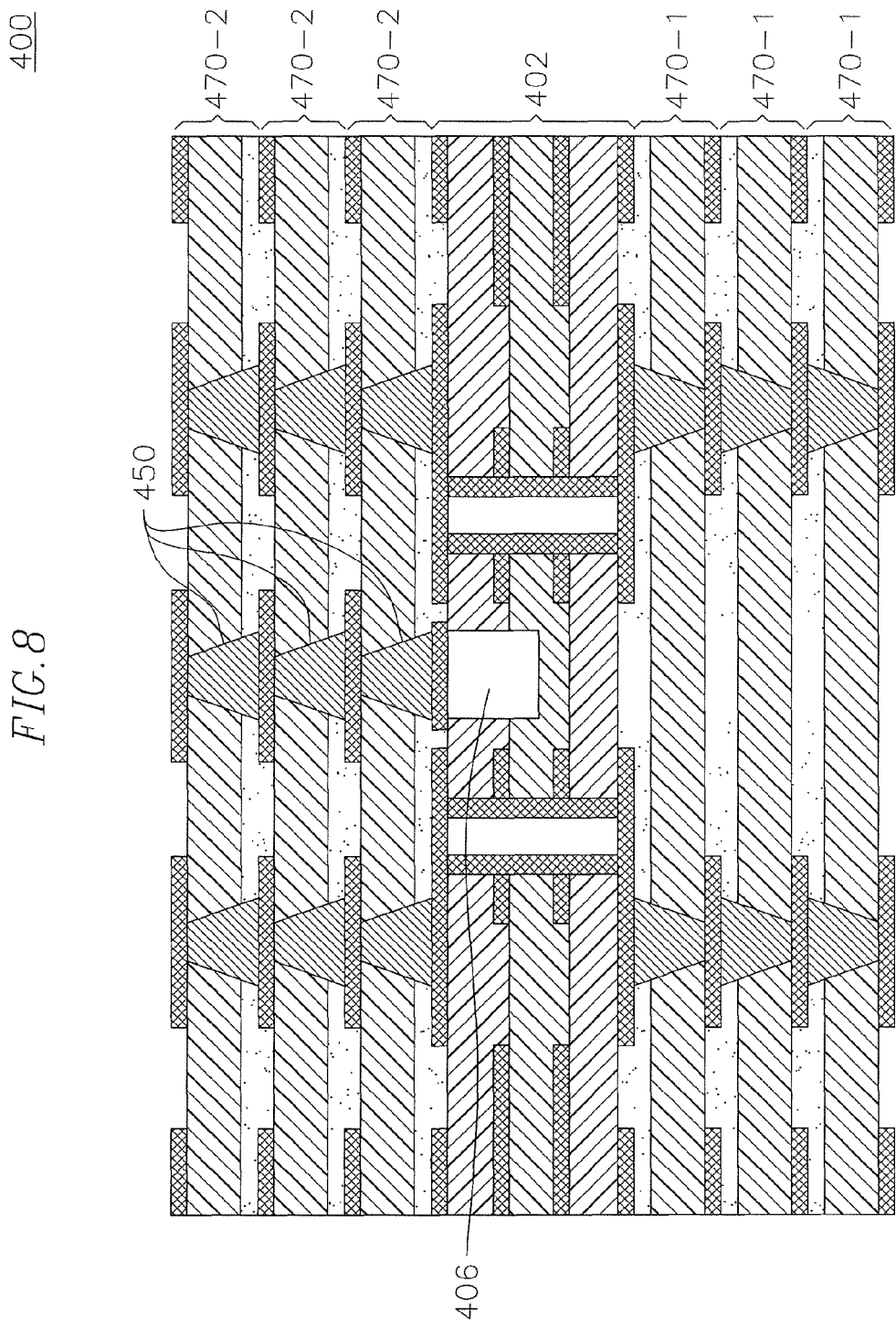
FIG. 8 is a cross sectional view of a mixed printed circuit board including six of the single metal layer substrates of FIG. 3g sandwiching a core subassembly including an active device in accordance with one embodiment of the present invention.

FIG. 8 is a cross sectional view of a mixed printed circuit board 400 including six of the single metal layer substrates (470-1, 470-2) of FIG. 3g sandwiching a core subassembly 402 including an active device 406 in accordance with one embodiment of the present invention. The mixed PCB 400 illustrated in FIG. 8 is similar to that of FIG. 5 except that the core subassembly 402 includes the embedded active device 406 and the upper single metal layer substrates 470-2 include additional micro vias 450 forming a stacked via for connection to the active device 406. The active device 406 can be a transistor, integrated circuit, or other active device commonly used in conjunction with a printed circuit board. In the embodiment illustrated in FIG. 8, the mixed PCB 400 includes a single active device 406. In other embodiments, additional active devices can be used along with additional vias to support various connections needed. In several embodiments, the structure of the mixed PCB of FIG. 8 can be modified in a manner similar to the modifications described above for the mixed PCBs of FIGS. 4a, 4b, 4c, 5 and 6. In one embodiment, the active device can be located on or within one of the single metal layer substrates. In another embodiment, active devices can be located on or within any of the single metal layer substrates and the core subassembly.

Figure 9:
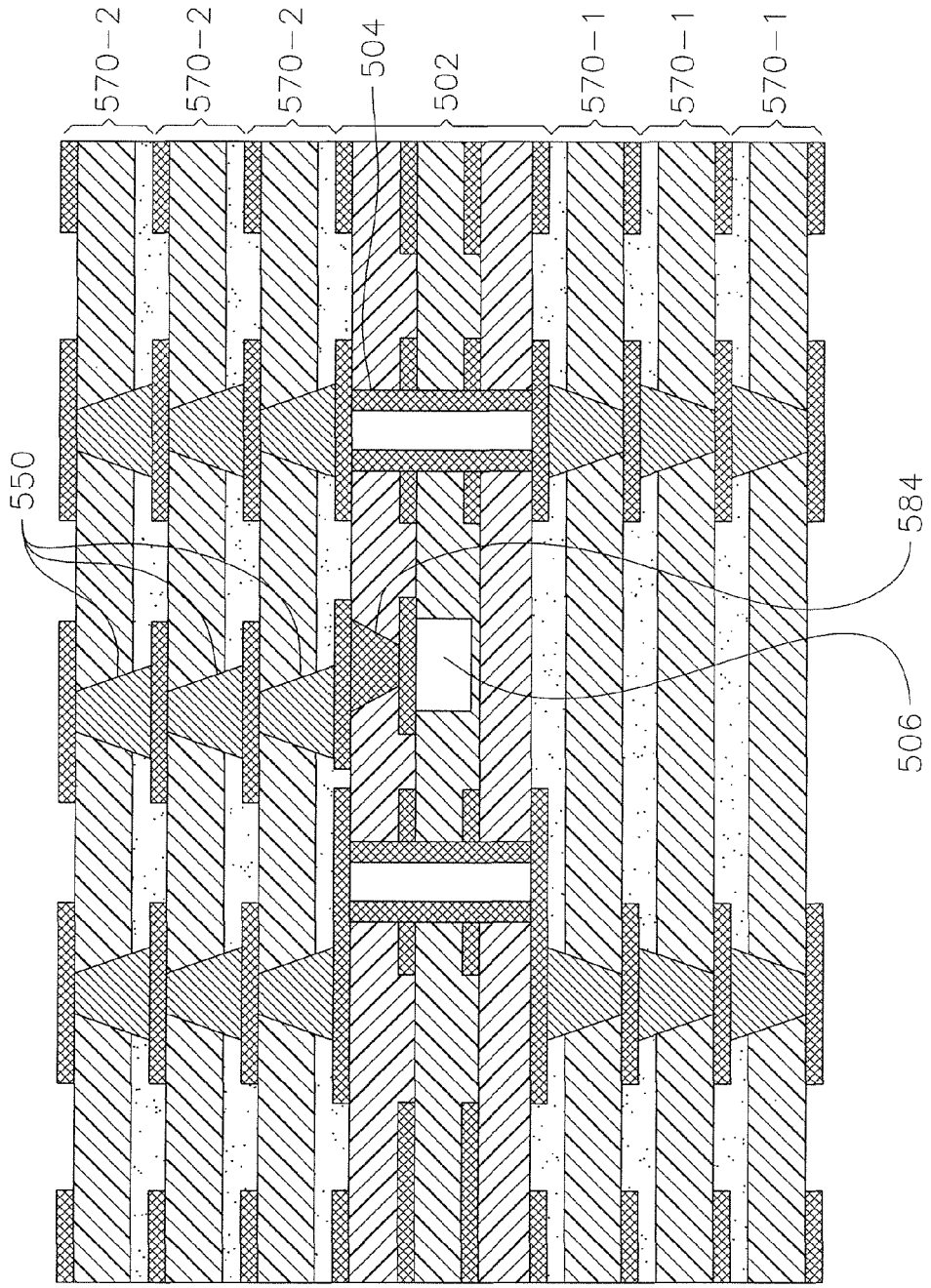
FIG. 9 is a cross sectional view of a mixed printed circuit board including six of the single metal layer substrates of FIG. 3g sandwiching a core subassembly including an active device in accordance with one embodiment of the present invention.

FIG. 9 is a cross sectional view of a mixed printed circuit board 500 including two of the single metal layer substrates (570-1, 570-2) of FIG. 3g sandwiching a core subassembly 502 including an active device 506 in accordance with one embodiment of the present invention. The PCB illustrated in FIG. 9 is substantially similar to that of FIG. 8 except that it includes an additional via 584 to connect the active device 506 which is embedded further within the core assembly 502 than in FIG. 8. In other respects, the mixed PCB of FIG. 9 can function and be modified as the mixed PCB of FIG. 8.

Figure 10:
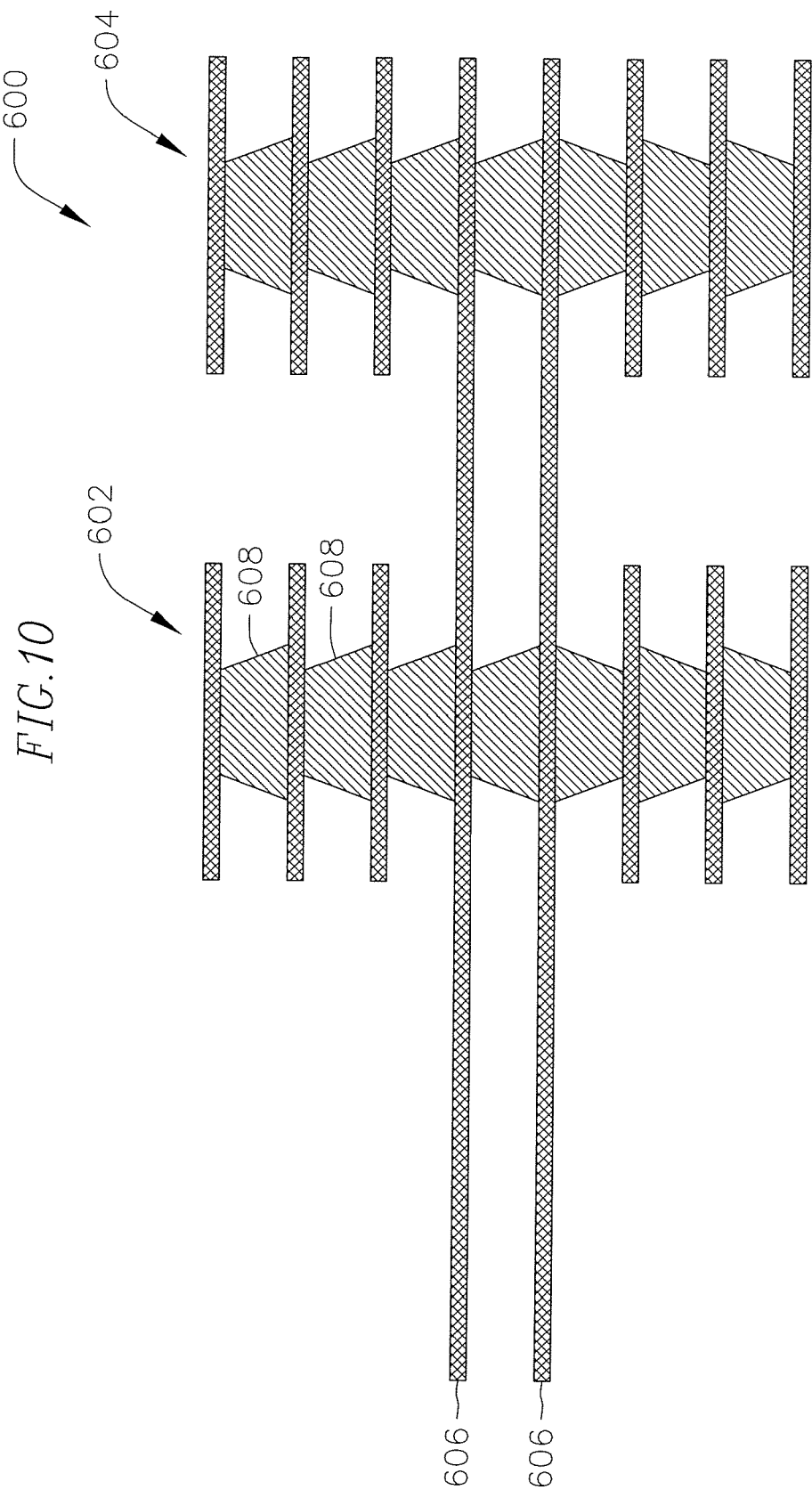
FIG. 10 is a cross sectional view of a printed circuit board assembly including cutout regions that will isolate the flexible portion of the assembly from the rigid section in accordance with one embodiment of the present invention.

FIG. 10 is a cross sectional view of a printed circuit board assembly 600 including cutout regions that will isolate the flexible portion 606 of the assembly from the rigid sections (602, 604) in accordance with one embodiment of the present invention. Vias 608 can provide electrical interconnects between the various flexible, rigid, and rigid-flex layers.

In several embodiments, the circuit board assembly 600 can be formed using any of the manufacturing processes described herein, including, for example, the single lamination processes described above in FIGS. 3a-3g, 4a-4c. Conventional lamination processes, including sequential lamination type processes, require a relatively large number of process steps that can damage a flexible or rigid-flex substrate during the manufacturing process. More specifically, conventional process steps such as plating, cleaning, scrubbing, and planarization can damage flexible or rigid-flex substrates and cause problems related to establishing certain positional tolerances. In accordance with manufacturing processes described herein, the circuit board assembly 600 can be formed while avoiding or substantially reducing numerous iterative steps common to the conventional processes, including, for example, the intrusive plating, cleaning, scrubbing, and planarization process steps.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

For example, the manufacturing processes described herein can be used in conjunction with a number of technologies, including, without limitation, flip chip, MEMS circuits, ceramic packages, organic packages, high density substrates, BGA substrates, rigid substrates, flexible substrates, and rigid-flex substrates.

In some embodiments, the micro vias and vias described herein may be referred to as Z-axis interconnects.

In embodiments described above, circuit board assemblies are formed using through hole vias, vias, micro vias, blind vias or other vias. In other embodiments, these vias can be used interchangeably and/or replaced with other suitable vias known in the art.

What is claimed is:

1. A method of manufacturing a printed circuit board comprising:
   providing a core subassembly comprising at least one metal layer carrier;
   providing a plurality of one-metal layer carriers after parallel processing each of the plurality of one-metal layer carriers, wherein the parallel processing of at least one of the plurality of one-metal layer carriers comprises:
      imaging photo resist onto at least one part of a substrate having at least one copper foil formed on a first surface of the substrate;
      etching portions of the at least one copper foil from the substrate;
      removing the at least one photo resist to expose the at least one part of the at least one copper foil thereby forming at least one copper foil pad;
      applying a lamination adhesive to a second surface of the substrate;
      applying a protective film to the lamination adhesive;
      forming at least one micro via in the second surface of the substrate to expose the at least one copper foil pad;
      filling conductive paste into the at least one micro via; and
      removing the protective film to expose the lamination adhesive on the substrate for attachment; and
   attaching at least two of the plurality of one-metal layer carriers with each other and with the core subassembly, wherein the substrate comprises a substrate selected from the group consisting of a flexible substrate and a rigid-flex substrate.

2. The method of claim 1, wherein the attaching the at least two of the plurality of one-metal layer carriers with each other and with the core subassembly comprises:
   attaching the at least two of the plurality of one-metal layer carriers with each other and with a first surface of the core subassembly; and
   attaching at least two of the plurality of one-metal layer carriers with each other and with a second surface of the core subassembly.

3. The method of claim 1, wherein the attaching the at least two of the plurality of one-metal layer carriers with each other and with the core subassembly comprises:
   attaching the at least two of the plurality of one-metal layer carriers with each other to form a first single lamination subassembly and with a first surface of the core subassembly; and
   attaching a first buildup layer, having at least one micro via, to a surface of the first single lamination subassembly.

4. The method of claim 1, wherein the attaching the at least two of the plurality of one-metal layer carriers with each other and with the core subassembly comprises:
   attaching the at least two of the plurality of one-metal layer carriers with each other to form a first single lamination subassembly and with a first surface of the core subassembly;
   attaching at least two of the plurality of one-metal layer carriers with each other to form a second single lamination subassembly and with a second surface of the core subassembly;
   attaching a first buildup layer, having at least one micro via, to a surface of the first subassembly; and
   attaching a second buildup layer, having at least one micro via, to a surface of the second subassembly.

5. The method of claim 1, wherein the core subassembly comprises at least one micro via.

6. The method of claim 1, wherein the core subassembly comprises at least one active device.

7. The method of claim 6, wherein the at least one active device comprises a device selected from the group consisting of a transistor and an integrated circuit.

8. The method of claim 1:
   wherein the attaching the at least two of the plurality of one-metal layer carriers with each other and with the core subassembly comprises attaching the at least two of the plurality of one-metal layer carriers with each other to form a first single lamination subassembly and with a surface of the core subassembly;
   wherein the core subassembly comprises a via;
   wherein a position of the via of the core subassembly is offset from a position of the micro vias of the first single lamination subassembly.

9. The method of claim 8, wherein the via of the core subassembly is a plated through hole via.

10. The method of claim 8, wherein the via of the core subassembly is a micro via.

11. The method of claim 8, wherein the via of the core subassembly is a micro via filled with copper.

12. The method of claim 8, wherein the via of the core subassembly is a micro via filled with conductive paste.

13. The method of claim 1:
   wherein the attaching the at least two of the plurality of one-metal layer carriers with each other and with the core subassembly comprises attaching the at least two of the plurality of one-metal layer carriers with each other to form a first single lamination subassembly and with a surface of the core subassembly;
   wherein the core subassembly comprises a via;
   wherein a position of the via of the core subassembly is substantially aligned with a position of the micro vias of the first single lamination subassembly.

14. A method of manufacturing a printed circuit board comprising:
- providing a core subassembly comprising at least one metal layer carrier;
- providing a plurality of one-metal layer carriers after parallel processing each of the plurality of one-metal layer carriers, wherein the parallel processing of at least one of the plurality of one-metal layer carriers comprises:
  - imaging photo resist onto at least one part of a substrate having at least one copper foil formed on a first surface of the substrate;
  - etching portions of the at least one copper foil from the substrate;
  - removing the at least one photo resist to expose the at least one part of the at least one copper foil thereby forming at least one copper foil pad;
  - applying a lamination adhesive to a second surface of the substrate;
  - applying a protective film to the lamination adhesive;
  - forming at least one micro via in the second surface of the substrate to expose the at least one copper foil pad;
  - filling conductive paste into the at least one micro via; and
  - removing the protective film to expose the lamination adhesive on the substrate for attachment;
- attaching at least two of the plurality of one-metal layer carriers with each other and with the core subassembly;
- providing at least one second one-metal layer carrier after parallel processing the one-metal layer carrier, wherein the parallel processing of the second one-metal layer carrier comprises:
  - applying a second lamination adhesive to a second surface of a second substrate having a copper foil formed on a first surface of the second substrate;
  - applying a second protective film to the second lamination adhesive;
  - forming at least one micro via in the second surface of the second substrate to expose a portion of the copper foil;
  - filling conductive paste into the at least one micro via; and
  - removing the second protective film to expose the second lamination adhesive on the second substrate for attachment;
- wherein the attaching the at least two of the plurality of one-metal layer carriers with each other and with the surface of the core subassembly comprises:
  - attaching the at least two of the plurality of one-metal layer carriers with each other to form a first single lamination subassembly and with a surface of the core subassembly; and
  - attaching the at least one second one-metal layer carrier to a surface of the first single lamination subassembly.

15. The method of claim 14, further comprising:
- attaching the at least two of the plurality of one-metal layer carriers with each other to form a second single lamination subassembly and with a second surface of the core subassembly; and
- attaching a second one-metal layer carrier of the at least one second one-metal layer carrier to a surface of the second single lamination subassembly.

16. A method of manufacturing a printed circuit board comprising:
- providing a core subassembly comprising at least one metal layer carrier;
- providing a plurality of one-metal layer carriers after parallel processing each of the plurality of one-metal layer carriers, wherein the parallel processing of at least one of the plurality of one-metal layer carriers comprises:
  - imaging photo resist onto at least one part of a substrate having at least one copper foil formed on a first surface of the substrate;
  - etching portions of the at least one copper foil from the substrate;
  - removing the at least one photo resist to expose the at least one part of the at least one copper foil thereby forming at least one copper foil pad;
  - applying a lamination adhesive to a second surface of the substrate;
  - applying a protective film to the lamination adhesive;
  - forming at least one micro via in the second surface of the substrate to expose the at least one copper foil pad;
  - filling conductive paste into the at least one micro via; and
  - removing the protective film to expose the lamination adhesive on the substrate for attachment;
- attaching at least two of the plurality of one-metal layer carriers with each other and with a first surface of the core subassembly; and
- attaching at least two of the plurality of one-metal layer carriers with each other and with a second surface of the core subassembly,
- wherein the substrate comprises a substrate selected from the group consisting of a flexible substrate and a rigid-flex substrate.

17. A method of manufacturing a printed circuit board comprising:
- providing a core subassembly comprising at least one metal layer carrier;
- attaching a plurality of one-metal layer carriers with each other after parallel processing each of the plurality of one-metal layer carriers to form a first subassembly, wherein the parallel processing of at least one of the plurality of one-metal layer carriers comprises:
  - imaging photo resist onto at least one part of a substrate having at least one copper foil formed on a first surface of the substrate;
  - etching portions of the at least one copper foil from the substrate;
  - removing the at least one photo resist to expose the at least one part of the at least one copper foil thereby forming at least one copper foil pad;
  - applying a lamination adhesive to a second surface of the substrate;
  - applying a protective film to the lamination adhesive;
  - forming at least one micro via in the second surface of the substrate to expose the at least one copper foil pad;
  - filling conductive paste into the at least one micro via; and
  - removing the protective film to expose the lamination adhesive on the substrate for attachment;
- attaching a plurality of one-metal layer carriers with each other after parallel processing each of the plurality of one-metal layer carriers to form a second subassembly;
- attaching the first subassembly to a first surface of the core subassembly; and
- attaching the second subassembly to a second surface of the core subassembly,
- wherein the substrate comprises a substrate selected from the group consisting of a flexible substrate and a rigid-flex substrate.

* * * * *